(12) United States Patent
Shimizu et al.

(10) Patent No.: US 7,691,356 B2
(45) Date of Patent: Apr. 6, 2010

(54) METHOD FOR PRODUCING TRICHLOROSILANE

(75) Inventors: Takaaki Shimizu, Niigata (JP); Kyoji Oguro, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/190,151

(22) Filed: Aug. 12, 2008

(65) Prior Publication Data

US 2009/0060817 A1    Mar. 5, 2009

(30) Foreign Application Priority Data

Sep. 5, 2007    (JP)    ............... 2007-229857

(51) Int. Cl.
*C01B 33/08*    (2006.01)
*C07F 7/00*    (2006.01)

(52) U.S. Cl. .................. 423/342; 423/341; 556/473

(58) Field of Classification Search .......... 423/324, 423/341, 342; 566/466, 473
See application file for complete search history.

(56) References Cited

U.S. PATENT DOCUMENTS

| 4,340,574 | A | * | 7/1982 | Coleman ............... 423/347 |
| 5,939,577 | A | * | 8/1999 | Wheeler et al. ........... 556/477 |
| 7,033,561 | B2 | * | 4/2006 | Kendig et al. ............ 423/342 |
| 2004/0052716 | A1 | | 3/2004 | Wakamatsu et al. |
| 2004/0131528 | A1 | | 7/2004 | Kendig et al. |

FOREIGN PATENT DOCUMENTS

| JP | 1-278411 | * | 11/1989 |
| JP | 2004-532786 | | 10/2004 |
| WO | WO 02/100776 A1 | | 12/2002 |

OTHER PUBLICATIONS

Brinson, J. Ashley, Recovery of Valuable Chlorosilane Intermediates by a Novel Waste Conversion Process, Jun. 20, 2002, US Department of Energy (Office of Scientific and Technical Information), DOE/AL/99566-4 (Report No.), p. 5.*

(Continued)

*Primary Examiner*—Stuart Hendrickson
*Assistant Examiner*—Richard M Rump
(74) *Attorney, Agent, or Firm*—Oblon, Spivak, McClelland, Maier & Neustadt, L.L.P.

(57) ABSTRACT

A by-product mixture produced in a process for producing polycrystalline silicon is made to react with chlorine to form tetrachlorosilane (STC) distillate in a chlorination reaction vessel, and the tetrachlorosilane (STC) distillate is made to react with hydrogen in a hydrogenation reaction vessel to be converted into trichlorosilane (TCS). In the chlorination step, methyl chlorosilanes having boiling points close to TCS are hyper-chlorinated to be converted into hyper-chlorinated methyl chlorosilanes having higher boiling points, which facilitates the hyper-chlorinated methyl chlorosilanes to be separated into high concentration, and inhibits carbon from contaminating the polycrystalline silicon. A donor/acceptor eliminator is provided in the circulation cycle for producing TCS, and accordingly there is no need to take out a by-product produced in the process for producing TCS to the outside of the system, which can highly purify the TCS.

16 Claims, 5 Drawing Sheets

OTHER PUBLICATIONS

U.S. Appl. No. 12/135,487, filed Jun. 9, 2008, Shimizu, et al.
U.S. Appl. No. 12/190,229, filed Aug. 12, 2008, Shimizu, et al.
U.S. Appl. No. 12/203,395, filed Sep. 3, 2008, Shimizu, et al.
Freeburne, Steven K., "The Conversion of Waste From Methylchlorosilane Production Into Valuable Products", Silicon for the Chemical Industry III, Sandefjord—Norway, Jun. 18-20, 1996, pp. 303-307.

* cited by examiner

METHOD FOR PRODUCING TRICHLOROSILANE

BACKGROUND OF THE INVENTION

1. Field of the Invention

The present invention relates to a production technology for obtaining high-purity trichlorosilane (TCS) from a by-product produced through a deposition reaction of polycrystalline silicon.

2. Description of the Related Art

In a process for producing high-purity polycrystalline silicon of a semiconductor grade, generally a "Siemens method" of reducing a trichlorosilane (TCS) gas and depositing the product on a silicon rod has been widely used.

As for the Siemens method, National Publication of International Patent Application No. 2004-532786 (Patent Document 1) discloses an invention relating to a method of producing polycrystalline silicon, which newly includes a step of converting disilane ($H_nCl_{6-n}Si_2$: n is a value of 0 to 6) that exists in a gaseous effluent coming out from a CVD process for producing a polycrystalline silicon, into mono-silane, in a hydrogenation reaction vessel for converting tetrachlorosilane (STC) into trichlorosilane (TCS). The method is evaluated to have advantages of enhancing a yield of a hydrogenation process by combining a hydrogenation reaction with a thermal decomposition reaction of disilane in the same reaction vessel which is the hydrogenation reaction vessel, and the like. TCS produced in the hydrogenation step is collected, and can be recycled to a step of depositing the polycrystalline silicon.

Incidentally, a by-product mixture produced when the polycrystalline silicon is deposited by reacting TCS with hydrogen also includes a poly-silane ($H_{2(n+1)-m}Cl_mSi_n$: n is an integer of 3 or 4 and m is an integer of 0 to 2(n+1)), other than disilane having a silicon atom number n of 2. Accordingly, when these poly-silanes can be effectively used, the by-product mixture produced in the step of depositing the polycrystalline silicon is recycled as a raw material for use in producing the polycrystalline silicon, and more specifically, the by-product mixture is facilitated to be recycled as the TCS, and a yield of the production process is further enhanced.

In other words, a conventional method of producing polycrystalline silicon including a method disclosed in National Publication of International Patent Application No. 2004-532786 (Patent Document 1) has a room to be improved in a process of converting the above described by-product mixture into the TCS as the raw material for use in producing the polycrystalline silicon.

In addition, in order to produce high-purity polycrystalline silicon of a semiconductor grade, it is required to enhance the purity of TCS which is to be the raw material. As a result, it is needed to prepare a step for removing impurities in the TCS and the by-product which are circulated and used in the process for producing the polycrystalline silicon. Accordingly, it is extremely important from a practical standpoint to design the process so as to facilitate the removal of impurities from the TCS and the by-product which are circulated and used in the process for producing the polycrystalline silicon.

SUMMARY OF THE INVENTION

The present invention is designed with respect to such a problem, and is directed at providing a method which can allow high-purity trichlorosilane (TCS) to be obtained from a by-product produced through a deposition reaction of polycrystalline silicon, and can further enhance a yield in a process for producing polycrystalline silicon.

In order to solve such a problem, a method for producing trichlorosilane according to the present invention includes: (A) a chlorination step of making a by-product mixture which is produced in a process for producing polycrystalline silicon and contains poly-silane represented by a chemical formula $H_{2(n+1)-m}Cl_mSi_n$ (where n is an integer of 2 to 4 and m is an integer of 0 to 2(n+1)) to react with chlorine to form tetrachlorosilane (STC) distillate; (B) a hydrogenation step of making the tetrachlorosilane (STC) distillate formed in the chlorination step react with hydrogen into trichlorosilane (TCS); and (C) a step of removing donor and acceptor impurities contained in chlorosilanes distillate produced in the hydrogenation step, and then separating the product into a mixture distillate containing hyper-hydrogenated chlorosilanes and trichlorosilane (TCS) distillate for use in producing the polycrystalline silicon.

The method for producing trichlorosilane according to the present invention can further include a step of making a distillate containing methyl chlorosilane (MeCS) produced in the hydrogenation step circulate to the chlorination step and forming a hyper-chlorinated methyl chlorosilane.

In this case, the method for producing trichlorosilane may include a step of separating the hyper-chlorinated methyl chlorosilane from tetrachlorosilane (STC) distillate.

Furthermore, the method for producing trichlorosilane according to the present invention can further include a step of making the mixture distillate containing the hyper-hydrogenated chlorosilanes produced in the separation step circulate to the chlorination step and forming the tetrachlorosilane (STC).

The method for producing trichlorosilane according to the present invention can further include a step of making the mixture distillate containing hyper-hydrogenated chlorosilanes produced in the separation step circulate to the hydrogenation step and forming a lower-level-hydrogenated chlorosilane.

The method for producing trichlorosilane according to the present invention can further include a step of separating the distillate produced in the hydrogenation step into a distillate containing methyl chlorosilane (MeCS) and a distillate containing a hyper-hydrogenated chlorosilane.

The method for producing trichlorosilane according to the present invention may include a step of making a mixture distillate containing hyper-hydrogenated chlorosilanes which have not reacted in the chlorination step circulate to the chlorination step.

In the chlorination step of the method for producing trichlorosilane according to the present invention, the chlorination reaction is preferably carried out through any of a liquid-phase reaction under irradiation with light, a liquid-phase reaction under the presence of a radical initiator and a gas-phase reaction at a cleavage temperature of the molecule of chlorine or higher.

The reaction temperature in the above described hydrogenation step is, for instance, approximately 600 to 1,200° C. or approximately 400 to 600° C. In the latter case, the hydrogenation reaction is carried out in the presence of silicon.

When the reaction temperature in the above described hydrogenation step is approximately 400 to 600° C., hydrochloric acid (HCl) is preferably supplied to the above described hydrogenation step at the same time.

The method for producing trichlorosilane according to the present invention includes hyper-chlorinating methyl chlorosilanes having boiling points close to TCS into hyper-chlorinated methyl chlorosilanes having higher boiling points in the chlorination step, which facilitates the hyper-chlorinated methyl chlorosilanes to be separated into high concentration, and increases the purity of TCS to be finally obtained.

As a result, when the above described TCS is collected and recycled, the contamination of polycrystalline silicon by carbon is inhibited.

In addition, the method for producing trichlorosilane according to the present invention includes removing donor impurities and acceptor impurities which are contained in chlorosilane, in a circulation cycle in the process for producing the TCS, and accordingly does not need to take out a large amount of chlorosilane necessarily together with impurities to the outside of the system when removing the donor impurities and the acceptor impurities from the process of producing the TCS in order to purify the TCS.

As a result, an efficiency of the process for producing the TCS is enhanced.

Thus, the present invention can obtain high-purity trichlorosilane (TCS) from a by-product formed in a step of depositing polycrystalline silicon, and can further enhance a yield in a process for producing the polycrystalline silicon.

DESCRIPTION OF THE PREFERRED EMBODIMENTS

A method for producing trichlorosilane according to the present invention will now be described below with reference to the drawings. In the following description, polycrystalline silicon which has been produced by using trichlorosilane as a raw material obtained through the method according to the present invention will be described as high-purity polycrystalline silicon of a semiconductor grade, but the present invention is also effective for obtaining the polycrystalline silicon of a solar cell grade or the like.

Figure 1:
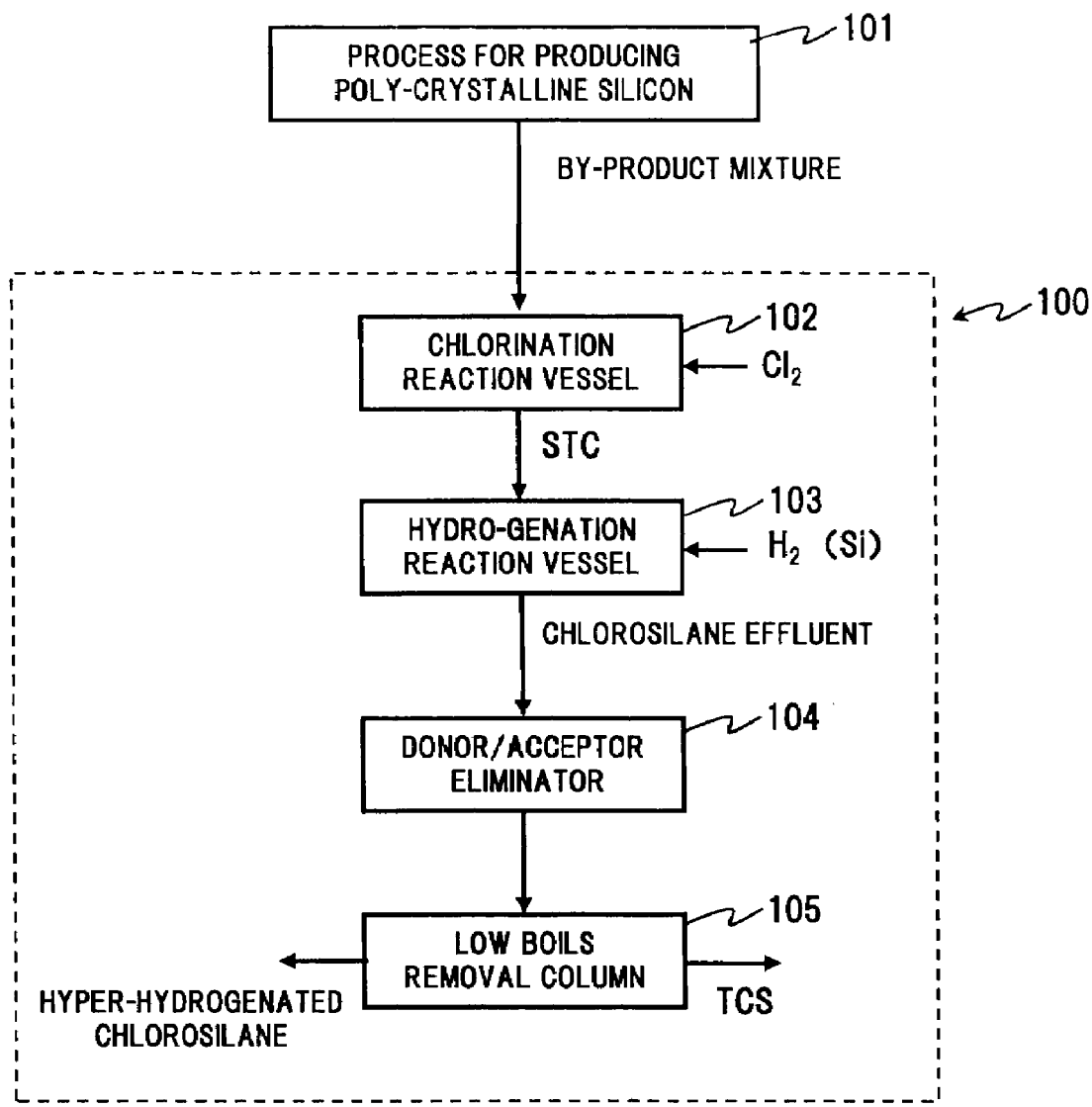
FIG. 1 is a view for describing a basic configuration (process) of a method for producing TCS according to the present invention.

[Basic configuration]: FIG. 1 is a view for describing a basic configuration (process) of a method for producing trichlorosilane according to the present invention. The process for producing TCS 100 includes: (A) a chlorination step of making a by-product mixture which is produced in a process for producing polycrystalline silicon and contains poly-silane represented by a chemical formula $H_{2(n+1)-m}Cl_mSi_n$ (where n is an integer of 2 to 4 and m is an integer of 0 to 2(n+1)) to react with chlorine to form tetrachlorosilane (STC) distillate; (B) a hydrogenation step of making the tetrachlorosilane (STC) distillate produced in the chlorination step react with hydrogen into trichlorosilane (TCS); and (C) a step of removing donor and acceptor impurities contained in the chlorosilane distillate produced in the hydrogenation step, and then separating the product into a mixture distillate containing hyper-hydrogenated chlorosilanes and trichlorosilane (TCS) distillate for use in producing the polycrystalline silicon.

Trichlorosilane (SiHCl$_3$:TCS) which is a silicon source and hydrogen (H$_2$) are supplied into a CVD reactor 101 which is provided in the outside of the system, and are converted into polycrystalline silicon which is deposited on a silicon rod (seed) electrically heated, through a "Siemens method" with the use of a reduction reaction of TCS. Thus, a high-purity polycrystalline silicon of a semiconductor grade is obtained (CVD step).

After this reaction, the CVD reactor 101 results in containing a by-product mixture including dichlorosilane (SiH$_2$Cl$_2$ : DCS), tetrachlorosilane (SiCl$_4$:STC), poly-silane, particulate silicon and the like, all of which have been produced during the reduction reaction, in addition to unreacted TCS. Here, poly-silane means a chemical compound which is generally represented by chemical formula $H_{2(n+1)-m}Cl_mSi_n$ (where n is an integer of 2 to 4 and m is an integer of 0 to 2(n+1)).

The by-product mixture is discharged from the CVD reactor 101, is supplied to a chlorination reaction vessel 102 comprising the process for producing TCS 100, and is reacted with chlorine (Cl$_2$) to form tetrachlorosilane (STC) distillate (chlorination step). In this chlorination step, tetrachlorosilane (STC) is formed from poly-silane by making the by-product mixture supplied from the above described CVD reactor 101 to react with chlorine, for instance, through a liquid-phase reaction in a temperature range of approximately −20 to 100° C. or a gas-phase reaction at a temperature of 400° C. or higher.

Figure 2:
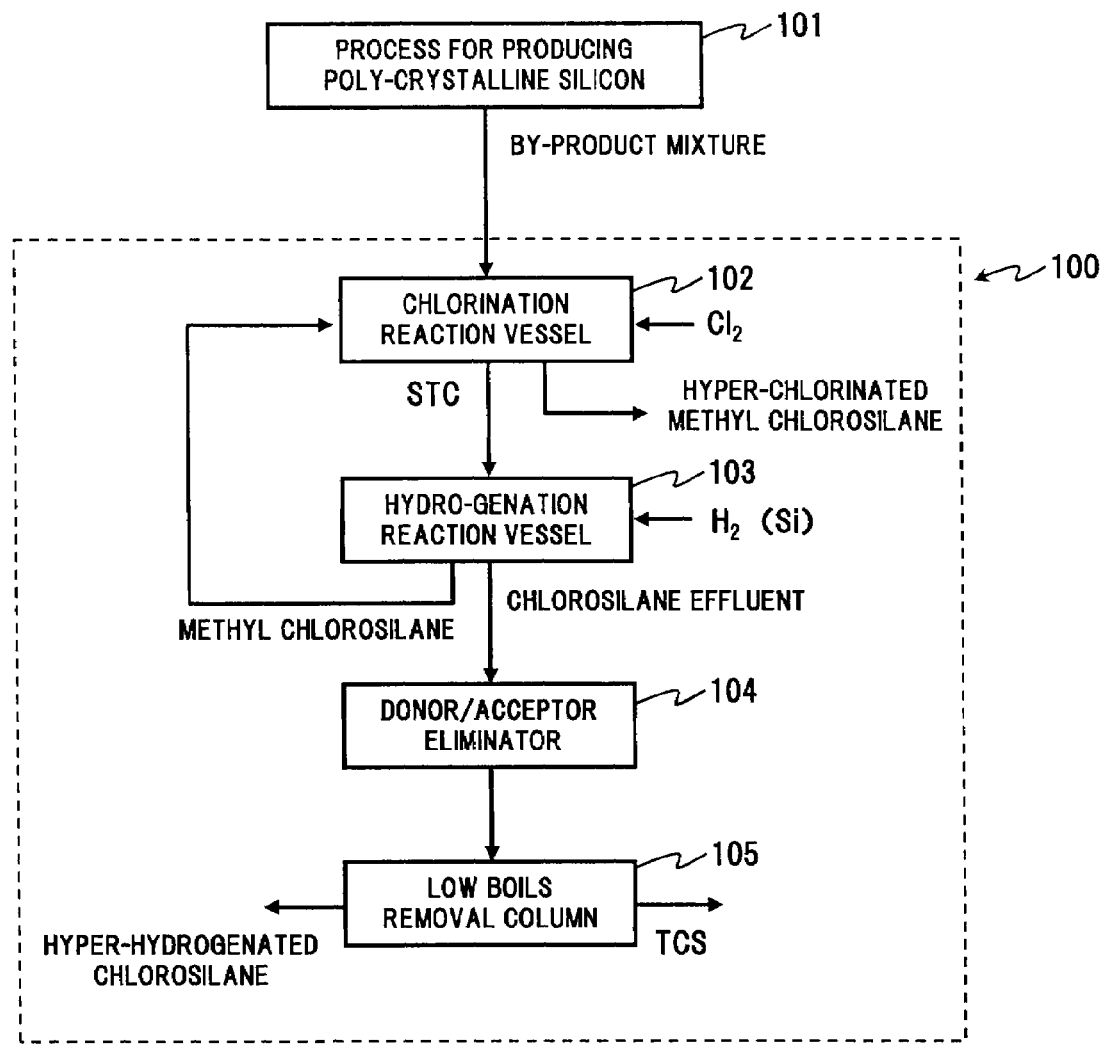
FIG. 2 is a view for describing another configuration example (first example) of a method for producing TCS according to the present invention.

In addition, in the chlorination step, it is also possible to make MeCS cause a reaction of forming a hyper-chlorinated methyl chlorosilane by making a distillate containing methyl chlorosilane (MeCS) formed in the hydrogenation step circulate to the chlorination step and react with chlorine there, as illustrated in FIG. 2.

These reactions will now be shown by chemical formulae below. In a reaction in which tetrachlorosilane (STC) is formed from poly-silane, when poly-silane is assumed to be pentachlorodisilane (Si$_2$HCl$_5$), hydrogen of an Si—H bond in pentachlorodisilane is chlorinated, and simultaneously an Si—Si bond is cleaved to newly form an Si—Cl bond, through the reaction formula (1) shown below. As a result, STC of 2 moles are produced from 1 mol pentachlorodisilane.

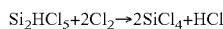     Reaction formula (1):

Si$_2$HCl$_5$+2Cl$_2$→2SiCl$_4$+HCl

The above described reaction formula (1) is illustrated on the assumption that poly-silane is pentachlorodisilane, but even when being hexachlorodisilane or heptachlorotrisilane, for instance, other than pentachlorodisilane, the poly-silane similarly forms STC through a reaction of forming the Si—Cl bond from the Si—H bond and forming the Si—Cl bond while cleaving the Si—Si bond.

In a reaction of producing a hyper-chlorinated methyl chlorosilane from MeCS, two reactions competitively proceed as are shown in the following reaction formula (2), when methyl chlorosilane is assumed to be methyl dichlorosilane (CH$_3$SiHCl$_2$). One is a reaction (upper formula) in which a hyper-chlorinated methyl chlorosilane (CH$_3$SiCl$_3$) is formed through the chlorination of the Si—H bond in methyl dichlorosilane, and the other is a reaction (lower formula) in which a hyper-chlorinated methyl chlorosilane (CH$_2$ClSiHCl$_2$) is formed through the chlorination of a C—H bond in a methyl group of a CH$_3$-Si bond. When excessive chlorine exists in the chlorination reaction vessel, the chlorination of the C—H bond further proceeds and a further-hyper-chlorinated methyl chlorosilane is produced.

Reaction formula (2):
$$CH_3SiHCl_2 + Cl_2 \rightarrow CH_3SiCl_3 + HCl$$
$$CH_3SiHCl_2 + Cl_2 \rightarrow CH_2ClSiHCl_2 + HCl$$

The above described reaction formula (2) is illustrated on the assumption that methyl chlorosilane is methyl dichlorosilane ($CH_3SiHCl_2$), but even when the methyl chlorosilane is another methyl chlorosilane (for instance, $CH_3SiCl_3$, $(CH_3)_2SiHCl$, $(CH_3)_2SiCl_2$, $(CH_3)_3SiCl$ and $CH_3SiH_2Cl$), the hyper-chlorinated methyl chlorosilane is similarly produced through the chlorination reaction for the Si—H bond, and the chlorination reaction for the C—H bond in the methyl group of the $CH_3$—Si bond.

In addition, a distillate containing methyl chlorosilane produced in a hydrogenation step may include a very small amount of hydrocarbon compounds such as isopentane having boiling points close to that of TCS, and the hydrocarbons are chlorinated at the same time to result in acquiring higher boiling points.

Figure 3:
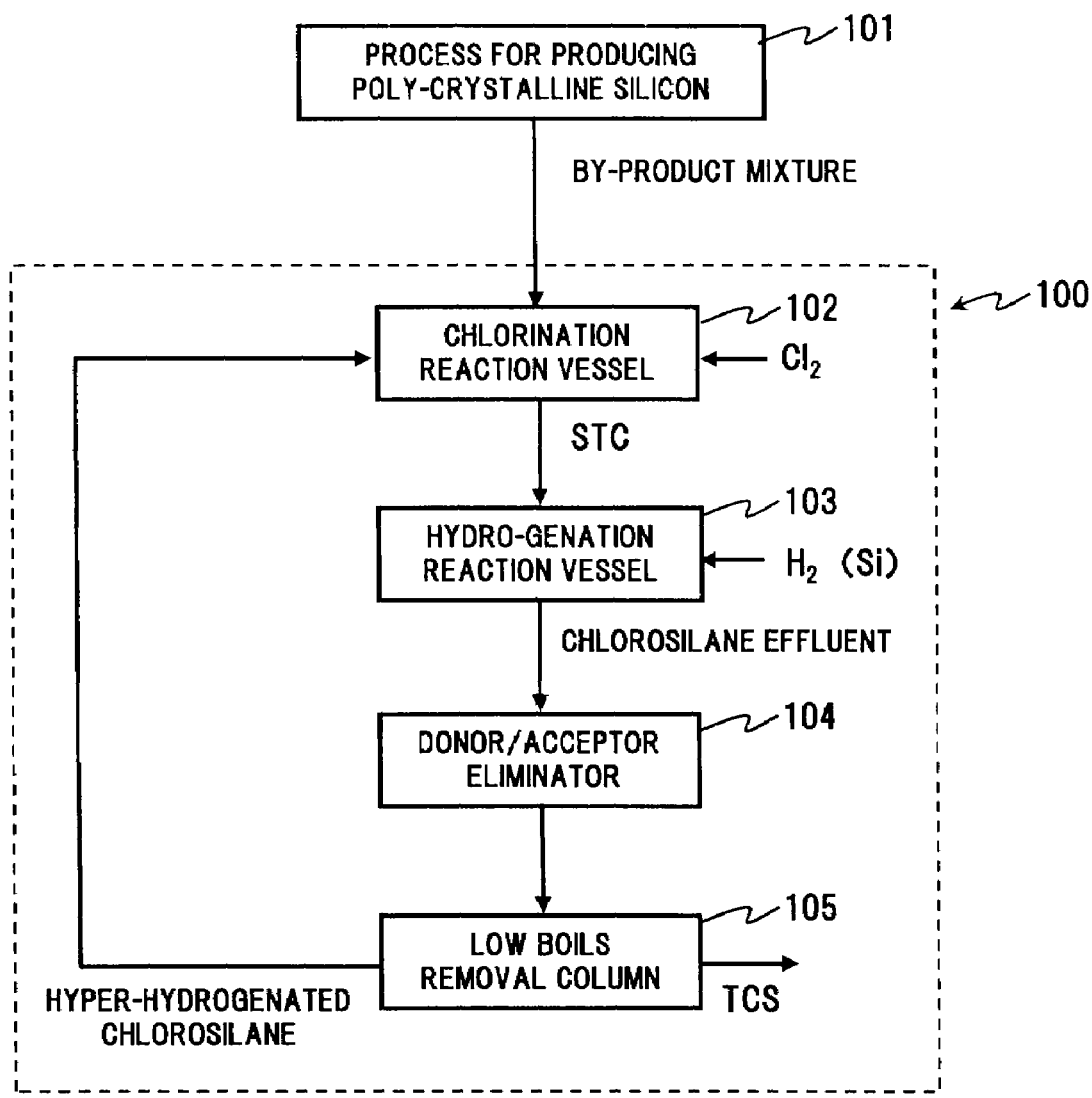
FIG. 3 is a view for describing another configuration example (second example) of a method for producing TCS according to the present invention.

Furthermore, in the chlorination reaction vessel 102, it is also possible to form a lower-level-hydrogenated chlorosilane such as TCS by chlorinating the hyper-hydrogenated chlorosilane which has been circulated from the hydrogenation step to a chlorination step through a donor/acceptor eliminator 104 and a low boils removal column 105, as is illustrated in FIG. 3, for instance. As is illustrated in the following reaction formula (3), for instance, when a hyper-hydrogenated chlorosilane is dichlorosilane ($SiH_2Cl_2$:DCS), hydrogen in DCS is chlorinated and TCS is consequently formed which is a lower-level-hydrogenated chlorosilane.

Reaction formula (3):
$$SiH_2Cl_2 + Cl_2 \rightarrow SiHCl_3 + HCl$$

In the above described reaction formula (3) is illustrated on the assumption that the hyper-hydrogenated chlorosilane is DCS, but even other hyper-hydrogenated chlorosilanes or hyper-hydrogenated silane are subjected to the chlorination reaction for the Si—H bond consecutively, as is illustrated in the reaction formula (4) shown below. Thus, the hyper-hydrogenated chlorosilane is sequentially converted into STC by being repeatedly circulated to the chlorination step from the hydrogenation step.

Reaction formula (4):
$$SiH_4 + Cl_2 \rightarrow SiH_3Cl + HCl$$
$$SiH_3Cl + Cl_2 \rightarrow SiH_2Cl_2 + HCl$$
$$SiH_2Cl_2 + Cl_2 \rightarrow SiHCl_3 + HCl$$
$$SiHCl_3 + Cl_2 \rightarrow SiCl_4 + HCl$$

In this way, a distillate containing tetrachlorosilane (STC) produced in the chlorination step is supplied to a hydrogenation reaction vessel 103, and is reacted with hydrogen to be converted into trichlorosilane (TCS) (hydrogenation step).

Furthermore, a high-purity TCS can be obtained by the steps of: removing the impurities in chlorosilane distillate discharged from the hydrogenation reaction vessel 103 by a donor/acceptor eliminator 104 to highly purify the chlorosilane distillate, and separating the product into hyper-hydrogenated chlorosilanes and TCS by a low boils removal column 105.

The donor/acceptor eliminator 104 is installed so as to make the TCS to be produced into a raw material for use in producing high-purity polycrystalline silicon by removing impurities (P, As and the like) which act as a donor and impurities (B, Al and the like) which act as an acceptor in silicon crystal from the TCS to an ultratrace level. In the present invention, the donor/acceptor eliminator 104 is provided in the circulation cycle for producing TCS, and accordingly there is no need to take out a large amount of chlorosilane necessarily together with impurities to the outside of the system when removing the donor impurities and acceptor impurities from the process for producing TCS in order to highly purify the TCS.

There are adoptable methods for removing the impurities, which include: a method of removing impurities by producing an adduct with an organic substance containing an element having a lone electron-pair such as thiophenol and benzaldehyde (See U.S. Pat. No. 3,126,248 (Patent Document 3) and U.S. Pat. No. 3,252,752 (Patent Document 4));

a method of removing impurities through a chemical reaction of forming an Si—O—B bond or an Si—O—P bond in an atmosphere containing a very small amount of oxygen (See Japanese-Patent-Application No. 58-500895 (Patent Document 5));

a method of removing impurities by making the impurities contact with a metal oxide such as silica gel and alumina gel which are hydrated (See U.S. Patent No. 4,112,057 (Patent Document 6));

a method of removing impurities by making the impurities contact with an aqueous solution of an inorganic salt such as $TiCl_4$ and $FeCl_3$ (See Japanese Patent Laid-Open No. 4-300206 (Patent Document 7));

a method of removing impurities by making the impurities contact with a fluoride salt of an alkali or alkaline earth element (See Japanese Patent Laid-Open No. 2001-2407 (Patent Document 8)); and a method of simultaneously non-volatilizing and fixing both impurities which act as a donor and an acceptor by dissolving oxygen into a chlorosilane liquid and making the impurities react with benzaldehyde.

After the donor/acceptor eliminator has removed the donor/acceptor impurities from a hyper-hydrogenated chlorosilane containing TCS, the low boils removal column 105 distills the resultant hyper-hydrogenated chlorosilane in order to recover and separate the hyper-hydrogenated chlorosilane, and separates the hyper-hydrogenated chlorosilane into a hyper-hydrogenated chlorosilane rich mixture distillate containing comparatively less TCS and a TCS distillate.

Figure 4:
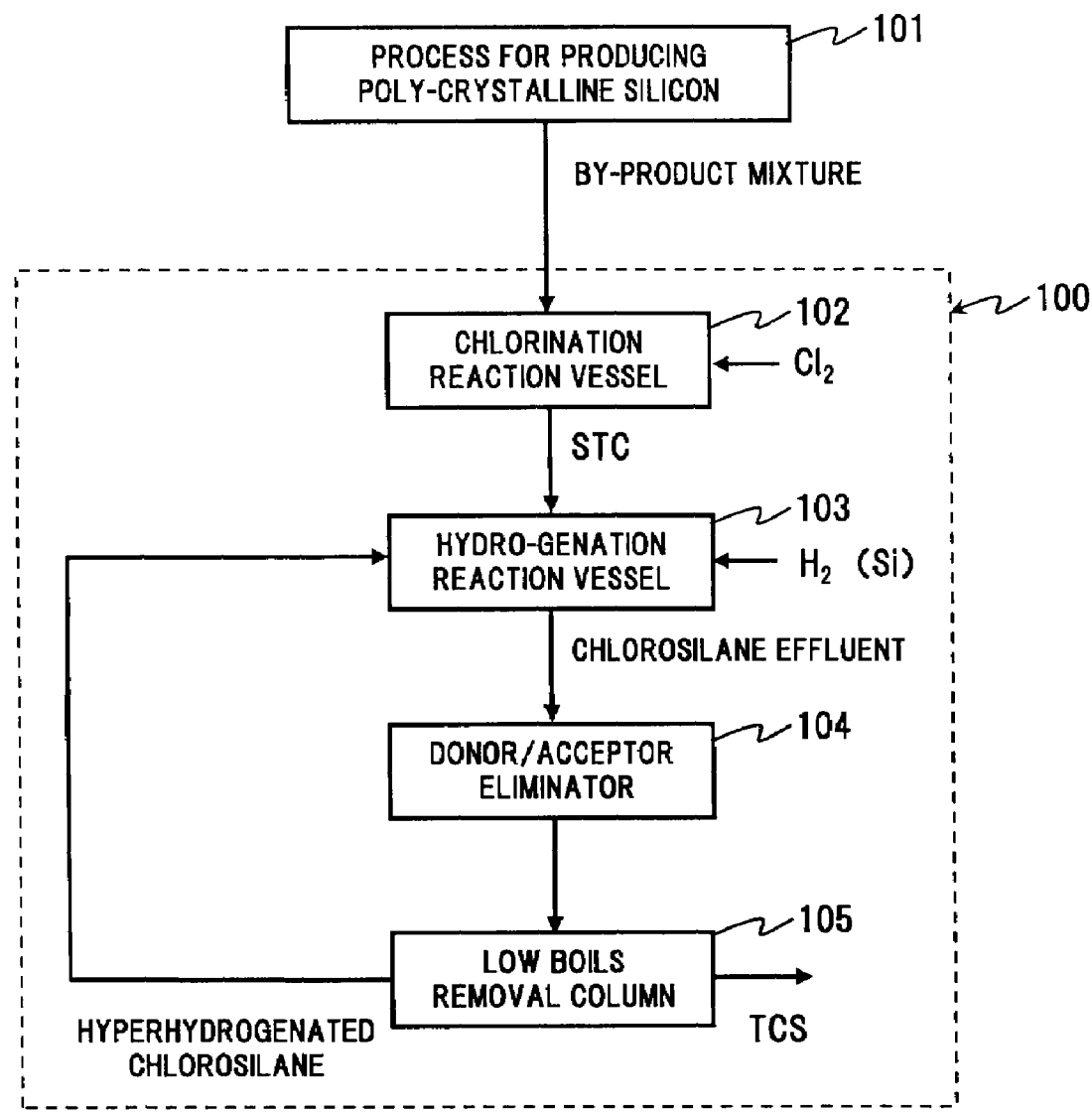
FIG. 4 is a view for describing another configuration example (third example) of a method for producing TCS according to the present invention.

Among them, the former (further-hyper-hydrogenated chlorosilane rich mixture distillate) can be circulatingly supplied to the chlorination step and the hydrogenation step, as is illustrated in FIG. 3 and FIG. 4, for instance.

On the other hand, the latter (TCS distillate) is further highly purified by further being subjected to a distillation purification step. When the high-purity TCS is circulated to the above described CVD step, the high-purity TCS can be recycled as a raw material for use in producing polycrystalline silicon.

A chlorination reaction expressed by the above described reaction formulae (1) to (3) can be carried out through any of a liquid-phase reaction under irradiation with light, a liquid-phase reaction under the presence of a radical initiator and a gas-phase reaction at a cleavage temperature of the molecule of chlorine or higher.

A chlorination reaction (photo-chlorination) under irradiation with light is a method of forming tetrachlorosilane (STC) from poly-silane by irradiating the poly-silane with light in the presence of chlorine. The usable light has a wavelength corresponding to the absorption wavelength of a Cl—Cl bond in the molecule of chlorine, and is emitted from a light source such as a low-pressure mercury lamp, a high-pressure mercury lamp and a xenon lamp, as is described in Japanese Patent Laid-Open No. 4-202007 (Patent Document 2).

In the case of a chlorination reaction in the presence of the radical initiator, AIBN (azobisisobutyronitrile), BPO (benzoyl peroxide) or the like is used as the radical initiator. However, when the radical initiator is employed, the radical initiator is thermally decomposed into a radical, and the radical causes a chain-reaction in the molecule of chlorine to produce Cl radical. When the radical initiator is thermally decomposed, and organic fragment having a low boiling point is simultaneously formed, and becomes a contamination factor in the system. Accordingly, the organic fragment needs to be removed. For this reason, photo-chlorination without the need of using the radical initiator is preferred.

The chlorination reaction in the presence of the radical initiator can be carried out in a wide range of approximately −20° C. to 100° C., but can also be carried out in a temperature range (approximately 10 to 40° C.) at which special cooling and heat treatment are not required, because the reaction is a radical reaction and accordingly proceeds even at room temperature. Since the reaction is a liquid-phase reaction, the pressure is not restricted, but it is preferable to control the pressure into a range of atmospheric pressure to 0.2 MPa, from the viewpoint of the pressure resistance of a reaction vessel and the like.

An amount of chlorine to be introduced into a chlorination reaction vessel 102 needs to be at least a sufficient stoichiometric amount for progressing the chlorination reaction shown in the above described reaction formulae (1) to (3). However, because various reactions simultaneously and competitively proceed in the chlorination reaction vessel 102, when the concentration of the reaction raw material is low, the amount of chlorine needs to be greatly excessive. For instance, chlorine of approximately 5 to 15 times of the stoichiometric amount needs to be supplied.

However, chlorine which has not reacted with silane and chlorosilane compounds because the excessive amount of chlorine has been supplied and dissolves in a liquid produced by the reaction can be recovered from the produced liquid. Accordingly, if the unreacted chlorine would be recycled as chlorine for supply, the amount of chlorine to be supplied from the outside of the system can be almost equalized to real consumption of chlorine, and a stoichiometric ratio of chlorine in the chlorination reaction vessel 102 can also be maintained to an intended condition (for instance, approximately 5 to 15 times of the stoichiometric amount).

The chlorination reaction expressed by the above described reaction formulae (1) to (3) can be carried out through a gas-phase reaction at a cleavage temperature of the molecule of chlorine or higher (preferably through gas-phase reaction at approximately 400° C. to 600° C.), but causes more side reactions compared to a liquid-phase reaction, and accordingly is less advantageous compared to the liquid-phase method from the viewpoint of energy consumption as well.

In a hydrogenation step, a hydrogenation reaction proceeds to convert STC into TCS, but in addition to the hydrogenation reaction, such conversion reactions also proceed at the same time as a reaction of converting TCS into dichlorosilane (DCS), a reaction of converting DCS into mono-chlorosilane (MCS) and a reaction of converting MCS into mono-silane (SiH$_4$:MS), though the amounts of the reactions are small.

Accordingly, as is illustrated in FIG. 3, for instance, hyper-hydrogenated silanes such as DCS, MCS and MS can be mixed with some amount of TCS into a mixture, and the mixture can be distilled off (circulated) to a chlorination step, and be chlorinated and converted into STC in the step. Then, the STC can be circulated and used in the hydrogenation step again. Furthermore, STC can be additionally supplied from the outside of the system, as one part of a raw material STC in the hydrogenation step.

The reaction in the hydrogenation step is classified generally into a hydrogenation reaction in a comparatively high temperature range of approximately 600 to 1,200° C., and a hydrogenation reaction in a comparatively low temperature range of approximately 400 to 600° C. (for instance, under pressure of approximately 100 to 600 psig) (see, for instance, National Publication of International Patent Application No. 2004-532786 (Patent Document 1), Japanese Patent Laid-Open No. 58-217422 (Patent Document 9) and the like). The hydrogenation reaction in the temperature range of approximately 600 to 1,200° C. is a gas-phase homogenous reaction, and progresses according to the following reaction formula (5). The hydrogenation reaction in the temperature range of approximately 400 to 600° C. is a fluidized bed reaction, and progresses according to the following reaction formula (6) and the following reaction formula (7) which occurs as a result of the following reaction formula (6).

$$SiCl_4 + H_2 \rightarrow SiHCl_3 + HCl \quad \text{Reaction formula (5):}$$

$$3SiCl_4 + 3H_2 \rightarrow 3SiHCl_3 + 3HCl$$

$$Si + 3HCl \rightarrow SiHCl_3 + H_2 \quad \text{Reaction formula (6):}$$

$$Si + 2H_2 + 3SiCl_4 \rightarrow 4SiHCl_3 \quad \text{Reaction formula (7):}$$

Accordingly, when the hydrogenation reaction is carried out in the temperature range of approximately 600 to 1,200° C., silicon does not need to be supplied. However, when the hydrogenation reaction is carried out in the temperature range of approximately 400 to 600° C., the silicon is supplied to the reaction, and the STC and other compounds are hydrogenated in the presence of the silicon.

In a hydrogenation step, STC distillate formed in a chlorination step reacts with carbon component structured in a hydrogenation reaction vessel or residual carbon in silicon (silicon of metallurgical grade) supplied from the outside, and forms by-products of methyl chlorosilanes (MeCS). The amount of the by-product is much more when the reaction temperature is higher.

These methyl chlorosilanes include a compound having a boiling point close to that of TCS. TCS has a boiling point of 31.5° C., whereas (CH$_3$)$_2$SiHCl has a boiling point of 34.5° C. and CH$_3$SiHCl$_2$ has a boiling point of 41.0° C., for instance.

It is difficult for a normal distillation operation to completely remove these methyl chlorosilanes having the near boiling points to TCS. For this reason, methyl chlorosilanes by-products which have the near boiling points and are regularly and continuously produced in the hydrogenation step are easily accumulated in the whole system of the process for producing polycrystalline silicon. As a result, methyl chlorosilanes are concentrated into a higher concentration than that in the by-product reaction, and cause carbon contamination of polycrystalline silicon deposited in a CVD step by methyl chlorosilanes.

Even if a fine distillation column has a large number of distillation trays installed so as to avoid such inconvenience, methyl chlorosilanes are separated only as a mixture containing TCS and STC because methyl chlorosilanes have boiling points close to that of TCS. For this reason, in order to prevent the methyl chlorosilanes from being accumulated and concentrated, the methyl chlorosilanes cannot help being discharged to the outside of the system together with a large quantity of TCS and STC, which has been a cause of the increasing in a production cost and a waste amount.

However, by using the above described reaction formula (2), the methyl chlorosilanes having boiling points close to that of TCS can be hyper-chlorinated into compounds having higher boiling points. For instance, $(CH_3)_2SiHCl$ having a boiling point of 34.5° C. is converted into $(CH_3)_2SiCl_2$ having a boiling point of 70.3° C. which is a higher boiling point.

The hyper-chlorinated methyl chlorosilanes obtained through the chlorination reaction are easily separated with a general distillation operation, accordingly can be easily separated into high concentration, and can be efficiently discharged (separated) to the outside of the system of a process for producing polycrystalline silicon, as is illustrated in FIG. 2, for instance. As a result, the contamination of TCS of the final product by carbon and a waste amount can be reduced. Incidentally, the hyper-chlorinated methyl chlorosilanes which have been separated into high concentration can be recycled as a raw material of a silicone resin and the like.

Thus, the chlorination step according to the present invention can easily remove impurities from TCS and by-products which are formed in the process. In particular, when the chlorination step is carried out through a liquid-phase reaction, the compounds can be chlorinated at room temperature with atmospheric pressure, so that the method according to the present invention has an advantage of showing a greater energy saving effect than a conventional method.

In the present invention, a distillation mixture including hyper-hydrogenated chlorosilane formed in a hydrogenation step can be circulated to the hydrogenation step again, as is illustrated in FIG. 4, for instance.

When a hydrogenation reaction is carried out in a comparatively low temperature range of approximately 400 to 600° C. (under pressure of approximately 100 to 600 psig), and when the hyper-hydrogenated chlorosilane is assumed to be DCS, a chemical reaction according to the following reaction formula (8) simultaneously proceeds together with the above described hydrogenation reaction occurring in the inside of a hydrogenation reaction vessel.

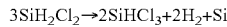  Reaction formula (8):
$$3SiH_2Cl_2 \rightarrow 2SiHCl_3 + 2H_2 + Si$$

In the present invention, $H_2$ and Si of by-products produced in the above described reaction formula (8) can be used as one part of hydrogen and silicon (for instance, metallurgical silicon) to be supplied to the reaction vessel in which STC is hydrogenated into TCS.

On the other hand, when the hydrogenation reaction is carried out in a comparatively high temperature range of approximately 600 to 1,200° C., and when the hyper-hydrogenated chlorosilane is assumed to be DCS, a chemical reaction according to the following reaction formula (9) simultaneously proceeds together with the above described hydrogenation reaction occurring in the inside of the hydrogenation reaction vessel.

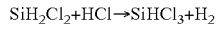  Reaction formula (9):
$$SiH_2Cl_2 + HCl \rightarrow SiHCl_3 + H_2$$

In the present invention, one part of HCl of a by-product produced in the hydrogenation reaction for STC is used as HCl (HCl in left-hand side) which is a raw material in the above described reaction formula (9), and a by-product $H_2$ produced in the reaction can be used as one part of a hydrogenating raw material for STC.

The above described reaction formulae (8) and (9) are shown on the assumption that the hyper-hydrogenated chlorosilane is DCS, but other hyper-hydrogenated chlorosilanes can also be circulated (collected) to the hydrogenation step.

In addition, when the hydrogenation reaction is carried out in a comparatively low temperature range of approximately 400 to 600° C., hydrogen chloride (HCl) may be supplied to the inside of the hydrogenation reaction vessel from outside at the same time, though the passage is not shown in the figure, and hydrogen chloride of a by-product produced in a CVD step for depositing polycrystalline silicon and a chlorination step may be recovered for a reaction with (metallurgical) silicon in a hydrogenation step and may be recycled as a TCS raw material. The hyper-hydrogenated chlorosilane is contained not only in the hydrogenation step for STC, but also in an exhaust gas of a by-product produced in the CVD step for obtaining polycrystalline silicon. The hyper-hydrogenated chlorosilane can also be recirculated to the hydrogenation step for STC, and can be effectively used as a raw material for TCS.

[Other configuration examples]: FIGS. 2 to 4 are views for describing other configuration examples (process examples) of a method for producing TCS according to the present invention.

The configuration example illustrated in FIG. 2 has the above described basic configuration (process), and in addition, has further a step of making a distillate containing methyl chlorosilane (MeCS) formed in a hydrogenation step (hydrogenation reaction vessel 103) circulate to a chlorination step (chlorination reaction vessel 102) and forming a hyper-chlorinated methyl chlorosilane.

The configuration example also has a step of separating the hyper-chlorinated methyl chlorosilane formed in the chlorination step (chlorination reaction vessel 102) from tetrachlorosilane (STC) distillate.

The configuration example illustrated in FIG. 3 has the above described basic configuration (process), and in addition, has further a step of making a mixture distillate containing hyper-hydrogenated chlorosilanes formed in a step of separating chlorosilane distillates into a mixture distillate containing hyper-hydrogenated chlorosilanes and trichlorosilane (TCS) distillate for use in producing polycrystalline silicon circulate to the chlorination step (chlorination reaction vessel 102) and forming tetrachlorosilane (STC).

The configuration example illustrated in FIG. 4 has the above described basic configuration (process), and in addition, has further a step of making a mixture distillate containing hyper-hydrogenated chlorosilanes formed in a step of separating chlorosilane distillates into the mixture distillate containing hyper-hydrogenated chlorosilanes and trichlorosilane (TCS) distillate for use in producing polycrystalline silicon circulate to the hydrogenation step (hydrogenation reaction vessel 103) and forming a lower-level-hydrogenated chlorosilane.

These configuration examples only illustrate aspects of a process for producing TCS according to the present invention, and the present invention can include various aspects.

EXAMPLE 1

Figure 5:
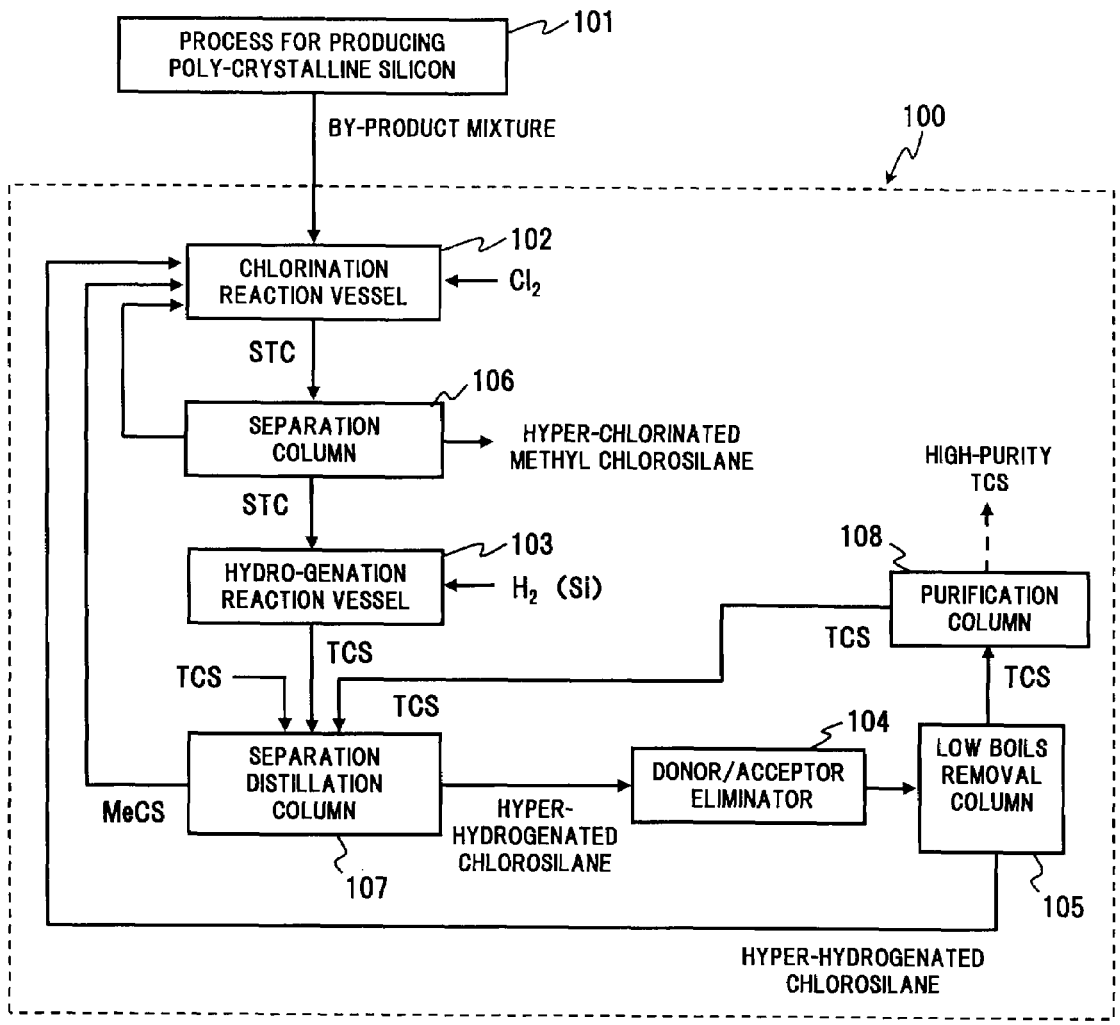
FIG. 5 is a view for describing a commercial process example of a method for producing TCS according to the present invention.

FIG. 5 is a view for describing an example of a commercial process for a method for producing TCS according to the present invention. In the present example, high-purity TCS was produced according to the process illustrated in FIG. 5.

A distilled STC (1,019 kg/hr) distilled off from a process of producing polycrystalline silicon 101 contained 0.37% of poly-silanes. A distilled STC (4,029 kg/hr) distilled off from a separation distillation column 107 contained 47 ppmw of methyl chlorosilanes and 340 ppmw of TCS. A mixture distillate (116 kg/hr) containing hyper-hydrogenated chlorosilanes distilled off from a low boils removal column 105 had a composition of 0.8 wt % MCS, 33.8 wt % DCS and 65.4 wt % TCS. The above 3 types of liquids were supplied to a chlorination reaction vessel 102 as well as chlorine gas of 98.4 kG/hr, which was supplied from the outside of the system.

The chlorination reaction vessel 102 had: a jacket and an external circulating cooling system for removing the heat of reaction; an absorption column for absorbing unreacted chlorine with a supplied liquid of a raw material; and a stripping column for stripping chlorine gas, and introducing the stripped chlorine gas again to the chlorination reaction vessel 102 circulatingly. The compounds were chlorinated by being irradiated with light emitted from four tubes of 2 kW high-pressure mercury lamps. The photo-chlorination reaction was conducted in a liquid-phase on conditions of a temperature of 30° C. and a reaction pressure of 0.02 Mpag.

Chlorine and hydrochloric acid were stripped off from the chlorinated product. Then, the produced liquid (5,255 kg/hr) with a composition comprising 47 ppmw hyper-chlorinated methyl chlorosilane, 99.22 wt % STC and 0.77 wt % TCS was distilled off therefrom, and was continuously supplied to a separation column 106.

The separation column 106 was constituted by two columns. From the top of the front column, a liquid mixture with a composition of 97.5 wt % TCS and 2.5 wt % STC was distilled off at a rate of 42 kg/hr and was cicululatingly supplied to the chlorination reaction vessel 102. From the bottom of the column, the rest was supplied to the back column. From the top of the back column, STC was distilled off at a rate of 5,212 kg/hr, and from the bottom of the column, a mixture liquid with a composition of 15 wt % hyper-chlorinated methyl chlorosilanes and 85 wt % STC was distilled off at a rate of 1.6 kg/hr.

To the hydrogenation reaction vessel 103 in which metallurgical silicon fluidized distilled STC produced in the back column of the separation column 106 and hydrogen were supplied at a mole ratio of 1:2 in a gaseous state. There, STC was hydrogenated on conditions of a reaction temperature of 520° C. and a reaction pressure of 2.5 Mpag. As a result of the hydrogenation reaction, a reaction product with a composition of 0.02 wt % MCS, 0.74 wt % DCS, 23.10 wt % TCS, 76.14 wt % STC and 36 ppmw methyl chlorosilanes was obtained.

Together with the reaction product, TCS (68 kg/hr) sent from the outside of the system and TCS (42 kg/hr) distilled off from the bottom of a purification column 108 were supplied to a separation distillation column 107. From the top of the separation distillation column 107, a distillate (1,370 kg/hr) containing hyper-hydrogenated chlorosilanes with a composition of 0.07 wt % MCS, 2.86 wt % DCS and 97.07 wt % TCS was distilled off, and was supplied to a donor/acceptor eliminator 104. On the other hand, from the bottom of the separation distillation column 107, a methyl chlorosilane (MeCS) distillate (4,029 kg/hr) with a composition of 340 ppmw TCS, 99.96 wt % STC and 47 ppmw methyl chlorosilanes was supplied to the chlorination reaction vessel 102.

A donor/acceptor eliminator 104 is a vessel provided with a stirrer. Donor/acceptor impurities were solidified as a non-volatile adduct in the vessel by introducing benzaldehyde into the vessel at a rate of 1 kg/hr while blowing a nitrogen gas containing 1.6 vol % oxygen by concentration into the eliminator vessel at a reaction temperature of 30° C. under a reaction pressure of 0.2 Mpag for a residence time of 1 hour.

The treated liquid was continuously discharged to an evaporator (not shown) from the donor/acceptor eliminator 104, and evaporated chlorosilanes were supplied to the low boils removal column 105 in a vapor state.

In the low boils removal column 105, a mixture containing 0.8 wt % MCS, 33.8 wt % DCS, 65.4 wt % TCS was circulatingly supplied to the chlorination reaction vessel 102 from the top of the column at the rate of 116 kg/hr, and TCS (1,254 kg/hr) was supplied to the purification column 108 from the bottom of the column.

In the purification column 108, high-purity TCS (1,212 kg/hr) was distilled off from the top of the column, and was supplied to a process 101 for producing polycrystalline silicon. On the other hand, TCS (42 kg/hr) was circulatingly supplied to the separation distillation column 107 from the bottom of the purification column 108. A distilled TCS distilled off from the purification column 108 included less than 0.1 ppmw of methyl dichlorosilane, and 0.4 ppmw of methyl chlorosilanes and isopentane in total.

Polycrystalline silicon obtained from the high-purity TCS distilled off from the top of the above described purification column 108 through a deposition step by the Siemens method was high-purity polycrystalline silicon containing impurities of 0.021 ppba of a donor, 0.007 ppba of an acceptor and 0.014 ppma of carbon by concentration.

EXAMPLE 2

In the present example, an example of only a photo-chlorination step will now be described.

A mixture liquid with a composition of 96.1 wt % STC, 3.3 wt % TCS, 0.3 wt % DCS, 0.2 wt % hexachlorodisilane, 85 ppm methyl dichlorosilane and 30 ppm methyl trichlorosilane was subjected to the photo-chlorination step of irradiating the mixture liquid with a light of a high-pressure mercury lamp at a temperature of 23° C. under atmospheric pressure for two hours while introducing chlorine gas into the mixture liquid.

As a result of having measured composition of the mixture liquid which had been treated in the photo-chlorination step, with gas chromatography, the mixture liquid showed the composition of 99.895 wt % STC, 0.1 wt % TCS, 0.002 wt % DCS and 0.001 wt % hexachlorodisilane and did not contain a detectable amount of methyl dichlorosilane and methyl trichlorosilane.

As described above, the present invention provides a method which can produce high-purity trichlorosilane (TCS) from a by-product formed through a deposition reaction of polycrystalline silicon, and can further enhance a yield in a process for producing the polycrystalline silicon.

What is claimed is:
1. A method for producing trichiorosilane, comprising:
   chlorinating a by-product mixture obtained from a process for producing polycrystalline silicon to form a distillate comprising tetrachiorosilane (STC);
   hydrogenating the tetrachiorosilane (STC) comprising distillate formed in the chlorination to form a chlorosilane effluent comprising trichlorosilane (TCS) and methyl chlorosilane (MeCS);
   removing donor and acceptor impurities from the chlorosilane effluent;
   separating the chlorosilane effluent from which donor and acceptor impurities are removed into a mixture distillate containing hyper-hydrogenated chlorosilanes and a trichlorosilane (TCS) distillate;
   recycling the trichlorosilane distillate to production of polycrystalline silicon;

distilling the methyl chlorosilane (MeCS) produced with residual carbon from the reactor or present in the silicon in the hydrogenation;

circulating the methyl chlorosilane distillate to the chlorination; and chlorinating the methyl chlorosilane to form a hyper-chlorinated methyl chlorosilane wherein the by-product mixture comprises a poly-silane represented by the chemical formula:

$$H_{2(n+1)-m}CL_mSi_n$$

wherein n is an integer of 2 to 4 and m is an integer of 0 to 2(n+1).

2. The method for producing trichlorosilane according to claim 1, further comprising separating the hyper-chlorinated methyl chlorosilane from the distillate comprising tetrachlorosilane (STC).

3. The method for producing trichiorosilane according to claim 1, further comprising:

recirculating the distillate containing the hyper-hydrogenated chlorosilanes to the chlorination and chlorinating the recirculated hyper-hydrogenated chlorosilanes to form tetrachlorosilane (STC).

4. The method for producing trichlorosilane according to claim 1, further comprising:

recirculating the distillate containing hyper-hydrogenated chlorosilanes to the hydrogenation and hydrogenating to form a lower-level-hydrogenated chlorosilane.

5. The method for producing trichlorosilane according to claim 1, further comprising separating the chlorosilane effluent comprising trichiorosilane distillate produced in the hydrogenation step into a distillate containing methyl chlorosilane (MeCS) and a distillate containing a hyper-hydrogenated chlorosilane.

6. The method for producing trichlorosilane according to claim 1, further comprising recirculating a distillate containing hyper-hydrogenated chlorosilanes which have not reacted in the chlorination to the chlorination.

7. The method for producing trichlorosilane according to claim 1, wherein the chlorinating comprises a reaction selected from the group consisting of a liquid-phase reaction under irradiation with light, a liquid-phase reaction under the presence of a radical initiator and a gas-phase reaction at a cleavage temperature of the molecule of chlorine or higher.

8. The method for producing trichlorosilane according to claim 1, wherein a reaction temperature in the hydrogenation is approximately 600 to 1,200° C.

9. The method for producing trichiorosilane according to claim 1, wherein a reaction temperature in the hydrogenation is approximately 400 to 600° C., and the hydrogenation is carried out in the presence of silicon.

10. The method for producing trichlorosilane according to claim 9, wherein hydrochloric acid (HCl) is supplied to the hydrogenation.

11. The method for producing trichlorosilane according to claim 1, wherein the donor impurities comprise at least one of P and As.

12. The method for producing trichlorosilane according to claim 1, wherein the acceptor impurities comprise at least one of B and Al.

13. The method for producing trichiorosilane according to claim 1, wherein an amount of chionne supplied to the chlorination is approximately 5 to 15 times the stoichiometric amount.

14. The method for producing trichlorosilane according to claim 7, wherein the chlorinating is a liquid-phase reaction.

15. The method for producing trichlorosilane according to claim 14, wherein a temperature of the chlorinating is room temperature and a pressure is atmospheric pressure.

16. The method for producing trichlorosilane according to claim 1, wherein the removing donor and acceptor impurities comprises at least one method selected from the group consisting of producing an adduct with an organic substance containing an element having a lone electron pair, forming an Si—O—B bond or Si—O—P bond in an atmosphere containing oxygen, contacting a metal oxide, contacting with an aqueous solution of an inorganic salt, contacting a fluoride salt of an alkali or alkaline earth element and dissolving oxygen into a chlorosilane liquid and reacting the impurities with benzaldehyde.

* * * * *